(12) United States Patent
Tsuruma et al.

(10) Patent No.: US 10,374,045 B2
(45) Date of Patent: Aug. 6, 2019

(54) SEMICONDUCTOR DEVICE AND ELECTRIC APPARATUS USING SAME

(71) Applicant: IDEMITSU KOSAN CO., LTD., Tokyo (JP)

(72) Inventors: Yuki Tsuruma, Chiba (JP); Takashi Sekiya, Chiba (JP); Shigekazu Tomai, Chiba (JP); Emi Kawashima, Chiba (JP); Yoshihiro Ueoka, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 16/064,210

(22) PCT Filed: Dec. 21, 2016

(86) PCT No.: PCT/JP2016/088234
§ 371 (c)(1),
(2) Date: Jun. 20, 2018

(87) PCT Pub. No.: WO2017/110940
PCT Pub. Date: Jun. 29, 2017

(65) Prior Publication Data
US 2019/0006473 A1 Jan. 3, 2019

(30) Foreign Application Priority Data

Dec. 25, 2015 (JP) .................. 2015-254761
Aug. 15, 2016 (JP) .................. 2016-159351

(51) Int. Cl.
*H01L 29/10* (2006.01)
*H01L 29/12* (2006.01)
(Continued)

(52) U.S. Cl.
CPC ...... *H01L 29/247* (2013.01); *H01L 21/02381* (2013.01); *H01L 21/02565* (2013.01);
(Continued)

(58) Field of Classification Search
USPC .......... 257/E29.338, 341, E29.013, E29.019, 257/E29.256, 104, 192, E21.359,
(Continued)

(56) References Cited

U.S. PATENT DOCUMENTS

2006/0113565 A1  6/2006  Abe
2011/0024741 A1  2/2011  Abe
(Continued)

FOREIGN PATENT DOCUMENTS

JP  2006165532 A  11/2004
WO  2015025499 A1  2/2015
WO  2015025500 A1  2/2015

OTHER PUBLICATIONS

International Search Report PCT/JP2016/088234 dated Mar. 7, 2017.
(Continued)

*Primary Examiner* — Niki H Nguyen
(74) *Attorney, Agent, or Firm* — Millen White Zelano and Branigan, PC

(57) ABSTRACT

A semiconductor device 1 which comprises a pair of an ohmic electrode 20 and a Schottky electrode 10 separated from each other, and a semiconductor layer 30 in contact with the ohmic electrode 20 and the Schottky electrode 10, and which satisfies the following formula (I):

$$n < \frac{\varepsilon V_e}{qL^2} \quad \text{(I)}$$

in which n is a carrier concentration (cm$^{-3}$) of the semiconductor layer, $\varepsilon$ is a dielectric constant (F/cm) of the semiconductor layer, $V_e$ is a forward effective voltage (V) between the ohmic electrode and the Schottky electrode, q is an elementary charge (C), and L is a distance (cm) between the ohmic electrode and the Schottky electrode.

20 Claims, 2 Drawing Sheets

(51) Int. Cl.
*H01L 29/24* (2006.01)
*H01L 29/812* (2006.01)
*H01L 21/02* (2006.01)
*H01L 29/872* (2006.01)
*H01L 29/47* (2006.01)
*H01L 29/45* (2006.01)

(52) U.S. Cl.
CPC ...... *H01L 21/02631* (2013.01); *H01L 29/812* (2013.01); *H01L 29/872* (2013.01); *H01L 29/45* (2013.01); *H01L 29/47* (2013.01)

(58) Field of Classification Search
USPC ............... 257/E21.418, E21.632, E29.197
See application file for complete search history.

(56) References Cited

U.S. PATENT DOCUMENTS

| | | | |
|---|---|---|---|
| 2015/0221725 A1* | 8/2015 | Tamura | H01L 29/7786 257/194 |
| 2016/0211386 A1* | 7/2016 | Tomai | H01L 29/47 |
| 2017/0141240 A1 | 5/2017 | Tomai et al. | |
| 2017/0263786 A1 | 9/2017 | Tomai et al. | |

OTHER PUBLICATIONS

Jayant Baliga et al: Fundamentals of Power Semiconductor Devices; ISBN 978-387-47314-7 (2008) pp. 95-100.
Written Opinion PCT/JP2016/088234 dated Mar. 7, 2017.

* cited by examiner

SEMICONDUCTOR DEVICE AND ELECTRIC APPARATUS USING SAME

TECHNICAL FIELD

The invention relates to a semiconductor device, and a Schottky barrier diode, a junction transistor, an electronic circuit as well as an electric apparatus using the semiconductor device.

BACKGROUND ART

As power semiconductor materials to actualize large current and low power consumption, Si can first be enumerated, and new materials of SiC, GaN and others can also be enumerated. In addition, gallium oxide and diamond are also promising as next generation materials. On the other hand, they are basically used in the form of monocrystals, and therefore they have drawbacks that growth of the monocrystals on different substrates is difficult and selection of the substrates is limited.

With respect to SiC, a preferable crystal structure as the power semiconductor is 4H—SiC, and as dielectric breakdown field of the same, 3 MV/cm or more is actualized. However, inconformity of lattices is large, and hence it is difficult to achieve epitaxial growth of the monocrystals with less defects on Si at a high yield ratio. In the case of 3C—SiC, the epitaxial growth can be achieved by applying micro fabrication to each of Si wafers or by using Si (211) face, but each bandgap is narrow, and so the dielectric breakdown field is limited at a level of 1.2 MV/cm. Moreover, in a case of GaN, its dielectric breakdown field is 3 MV/cm or more like 4H—SiC, and for mass production, crystal growth on Si has been tried. The inconformity of lattices of GaN to Si is not as bad as that of SiC, but the crystal growth is difficult unless a buffer layer such as AlN is interposed therebetween, which disturbs the mass production.

Thus, in Patent Document 1, there has been performed development to a power device in which conformity to a different substrate is intended by use of an oxide semiconductor of polycrystals or amorphous. In general, as described in Non-Patent Document 1, in the case of a uni-polar type power device, the following formula is established to obtain the lowest on-resistance, and if a withstand voltage design and a type of semiconductor material are determined, an optimal carrier concentration is determined. However, in an amorphous or polycrystal semiconductor, it is difficult to control the carrier concentration:

$$N_D = \frac{\varepsilon_S E_C^2}{2qBV}$$

in which $\varepsilon_s$ is a dielectric constant of the material, $E_c$ is a maximum dielectric breakdown field, q is an elementary charge, BV is a withstand voltage which is a design value, and $N_D$ is a carrier concentration.

RELATED ART DOCUMENTS

Patent Documents

[Patent Document 1] WO2015/025499A1
[Non-Patent Document 1] "Fundamentals of Power Semiconductor Devices", B. Jayant Baliga, Springer Science & Business Media, Apr. 2, 2010

SUMMARY OF INVENTION

An object of the invention is to provide a high withstand voltage and low resistance semiconductor device which does not require an initial carrier concentration control.

The present inventors have intensively researched a problem that a regulation of an initial carrier concentration is difficult. As a result, it has been found that if a semiconductor layer and electrodes satisfy a predetermined relational formula, a high withstand voltage and low resistance semiconductor device can be obtained under utilization of an external carrier, without any dependency on the carrier concentration, by a behavior principle different from a design guideline regarding a conventional uni-polar type power device. In consequence, the invention has been completed.

According to the invention, the following semiconductor device and others are provided.

1. A semiconductor device which comprises a pair of an ohmic electrode and a Schottky electrode separated from each other, and
   a semiconductor layer in contact with the ohmic electrode and the Schottky electrode, and
   which satisfies the following formula (I):

$$n < \frac{\varepsilon V_e}{qL^2} \quad (I)$$

in which n is a carrier concentration ($cm^{-3}$) of the semiconductor layer, $\varepsilon$ is a dielectric constant (F/cm) of the semiconductor layer, $V_e$ is a forward effective voltage (V) between the ohmic electrode and the Schottky electrode, q is an elementary charge (C), and L is a distance (cm) between the ohmic electrode and the Schottky electrode.

2. The semiconductor device according to 1, wherein the semiconductor layer consists of a metal oxide.
3. The semiconductor device according to 2, wherein the metal oxide comprises one or more elements selected from the group consisting of In, Zn, Ga, Sn and Al.
4. The semiconductor device according to any one of 1 to 3, wherein the Schottky electrode comprises one or more metals selected from the group consisting of Pd, Mo, Pt, Ir, Ru, W, Cr, Re, Te, Mn, Os, Fe, Rh, Co and Ni, and an oxide thereof.
5. The semiconductor device according to any one of 1 to 4, wherein the ohmic electrode comprises one or more metals selected from the group consisting of Ti, Mo, Ag, In, Al, W, Co and Ni, and a compound thereof.
6. The semiconductor device according to any one of 1 to 5, wherein the semiconductor layer is amorphous or comprises polycrystals.
7. The semiconductor device according to any one of 1 to 6, wherein a characteristic temperature of the semiconductor layer is 1500K or less.
8. The semiconductor device according to any one of 1 to 7, wherein when vertical lines are drawn from an outer periphery of a surface of the Schottky electrode toward a surface of the ohmic electrode, the surface of the ohmic electrode is present inside the vertical lines.
9. The semiconductor device according to any one of 1 to 8, wherein a withstand voltage is 0.5 MV/cm or more.
10. The semiconductor device according to any one of 1 to 9, wherein the semiconductor layer is interposed between the ohmic electrode and the Schottky electrode.
11. The semiconductor device according to 10, which further comprises a conductive silicon substrate, wherein the ohmic electrode or the Schottky electrode contacts with the conductive silicon substrate.

12. The semiconductor device according to any one of 1 to 9, wherein the ohmic electrode and the Schottky electrode are present, separated from each other, on one surface of the semiconductor layer.

13. A Schottky barrier diode wherein the semiconductor device according to any one of 1 to 12 is used.

14. A junction transistor wherein the semiconductor device according to any one of 1 to 12 is used.

15. An electronic circuit wherein the semiconductor device according to any one of 1 to 12, the Schottky barrier diode according to the above 13, or the junction transistor according to 14 is used.

16. An electric apparatus, an electronic apparatus, a vehicle or a power engine wherein the electronic circuit according to 15 is used.

According to the invention, there can provide a high withstand voltage and low resistance semiconductor device which does not require an initial carrier concentration control.

MODE FOR CARRYING OUT INVENTION

Figure 1:
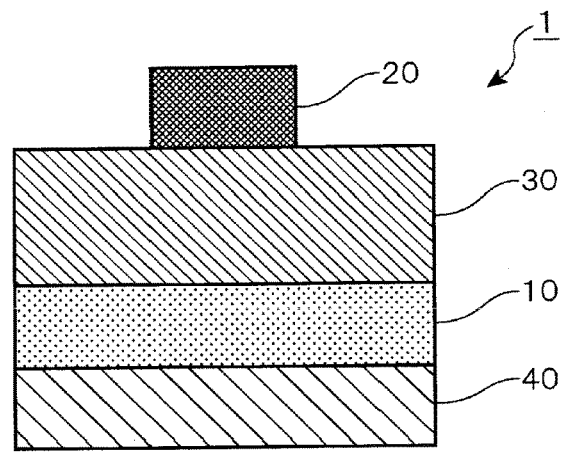
FIG. 1 is a schematic sectional view of a semiconductor device according to one embodiment of the invention.

A semiconductor device of the invention comprises a pair of an ohmic electrode and a Schottky electrode separated from each other, and a semiconductor layer in contact with the ohmic electrode and the Schottky electrode, and satisfies the following formula (I):

$$n < \frac{\varepsilon V_e}{qL^2} \quad (I)$$

in which n is a carrier concentration ($cm^{-3}$) of the semiconductor layer, $\varepsilon$ is a dielectric constant (F/cm) of the semiconductor layer, $V_e$ is a forward effective voltage (V) between the ohmic electrode and the Schottky electrode, q is an elementary charge ($1.602 \times 10^{-19}$ C), and L is a distance (cm) between the ohmic electrode and the Schottky electrode.

A lower limit of the n may be 0, but preferably $1 \times 10^{10}$ or more.

More preferably, the n satisfies the following formula (I-1), and further preferably, the following formula (I-2).

$$\frac{\varepsilon V_e}{qL^2} \times 10^{-7} < n < \frac{\varepsilon V_e}{qL^2} \quad (I\text{-}1)$$

$$\frac{\varepsilon V_e}{qL^2} \times 10^{-3} < n < \frac{\varepsilon V_e}{qL^2} \times 10^{-1} \quad (I\text{-}2)$$

In the above formulae, the carrier concentration is calculated by a CV (capacitance voltage) measurement using the following formula [refer to APPLIED PHYSICS LETTERS, 101, 113505 (2012)]:

$$\frac{A^2}{C^2} = \left(\frac{2}{\varepsilon_S \varepsilon_0 N_{depl}}\right)\left(V_{bi} - \frac{kT}{q} - V\right)$$

in which
A: area ($cm^2$) of a part on which the Schottky electrode and the ohmic electrode are overlapped,
C: measured capacitance value (F),
$\varepsilon_S$: specific dielectric constant (−),
$\varepsilon_0$: dielectric constant in vacuo ($8.854 \times 10^{-14}$ F/cm),
$N_{depl}$: carrier concentration ($cm^{-3}$),
$V_{bi}$: built-in voltage (V),
k: Boltzmann constant ($8.617 \times 10^{-5}$ eV/K),
T: sample temperature (K) at measurement,
q: elementary charge ($1.602 \times 10^{-19}$ C), and
V: applied voltage (V).

The L can be obtained by a method which will be described in Examples.

The Ve can be adjusted to 0.1 V as described later.

The dielectric constant $\varepsilon$ can be determined from a product of the specific dielectric constant and the dielectric constant in vacuo by use of a value of the specific dielectric constant described in a Document, if a composition and crystal system of a semiconductor type are determined. Alternatively, when the number of examples reported in the Document is small or the dielectric constant noticeably varies with the reported examples, actual measurement can be performed. In the case of the actual measurement, capacitance values of film thicknesses (L) at three points or more are measured because the CV measurement depends on the film thickness. When C/A is plotted along the ordinate and 1/L is plotted along the abscissa, an inclination of this graph indicates the dielectric constant $\varepsilon$, which can be utilized to calculate the dielectric constant.

The carrier concentration in the semiconductor layer is decreased so that the semiconductor device satisfies the formula (I). Specifically, a dopant concentration in a semiconductor is decreased. For example, in the case of the semiconductor in which a hydrogen atom present in the semiconductor or oxygen deficiency functions as a dopant as in an oxide semiconductor, formation of a high density film with less defects is effective for the decrease of the carrier concentration.

FIG. 1 is a schematic sectional view of the semiconductor device according to one embodiment of the invention.

A semiconductor device 1 (a vertical type) comprises a Schottky electrode 10, a semiconductor layer 30 and an ohmic electrode 20 in this order. The semiconductor device further comprises a conductive substrate 40 on a side of the Schottky electrode 10 which is opposite to a semiconductor layer 30 side.

Figure 2:
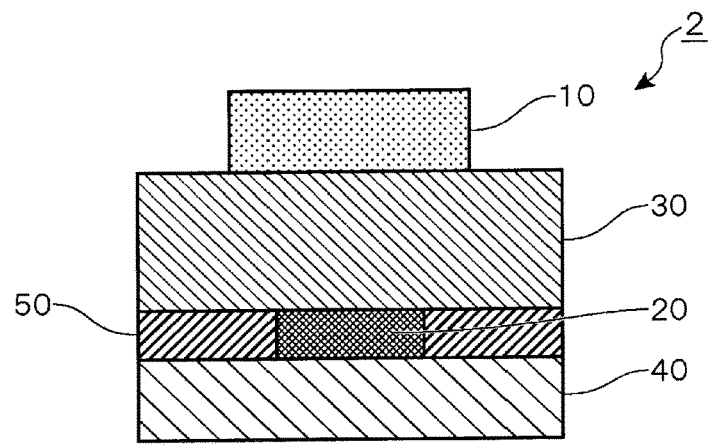
FIG. 2 is a schematic sectional view of a semiconductor device according to another embodiment of the invention.

FIG. 2 is a schematic sectional view of the semiconductor device according to another embodiment of the invention.

Figure 3:
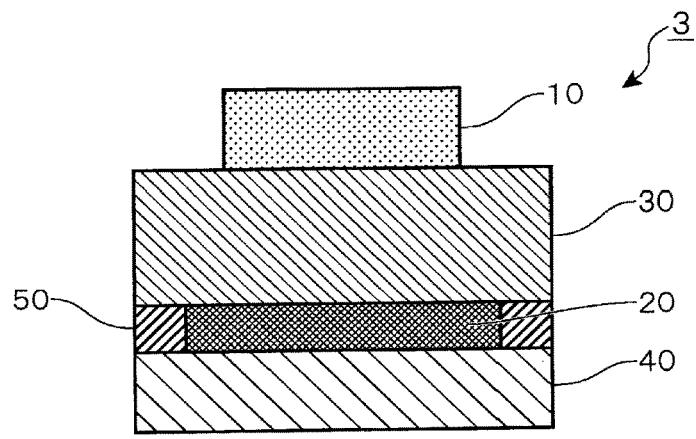
FIG. 3 is a schematic perspective view of a semiconductor device according to still another embodiment of the invention.

A semiconductor device 2 (a vertical type) comprises a Schottky electrode 10, a semiconductor layer 30, and an ohmic electrode 20 in this order. The semiconductor device further comprises a conductive substrate 40 on a side of the ohmic electrode 20 which is opposite to a semiconductor layer 30 side. Furthermore, there are insulating layers 50 on both sides of the ohmic electrode 20, and the ohmic electrode 20 and the insulating layers 50 on both sides form one layer. A semiconductor device 3 of FIG. 3 is different from the device 2 of FIG. 2 only in that a width of an ohmic electrode 20 is large.

Figure 4:
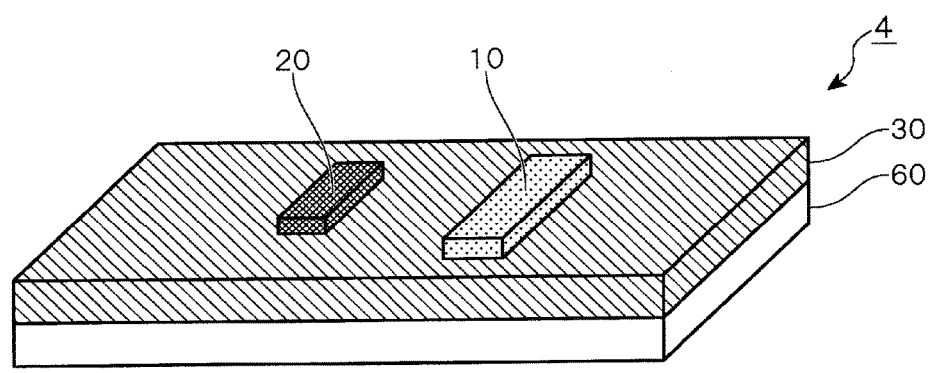
FIG. 4 is a schematic perspective view of a semiconductor device according to further embodiment of the invention.

FIG. 4 is a schematic sectional view of a semiconductor device according to further embodiment of the invention.

In a semiconductor device 4 (a horizontal type), a Schottky electrode 10 and an ohmic electrode 20 are separated from each other on a first surface, in the first surface and a second surface of a semiconductor layer 30 which face each other. The semiconductor device further comprises an insulating substrate 60 on the second surface of the semiconductor layer 30.

In the semiconductor device of the invention which satisfies the above formula (I), an initial carrier concentration of the semiconductor layer is small, and an external carrier functions as a main factor for electric conduction. The semiconductor layer has a small trap density, and does not disturb the conduction of the external carrier.

It is to be noted that in Patent Document 1, a semiconductor device satisfies a relation of the following formula, based on a design guideline regarding a carrier concentration of a conventional uni-polar type power device, and has a problem in controllability of the carrier concentration.

$$n > \frac{\varepsilon V_e}{qL^2}$$

in which n, ε, $V_e$, q and L are the same as those in the formula (I).

The semiconductor device of the invention has a small backward leak current and a low forward on-resistance, and a large current can be taken out from the device. Furthermore, even when an inexpensive silicon substrate or metal substrate is used as the conductive substrate, suitable rectification characteristics are developed. Additionally, even when an oxide semiconductor layer is prepared by a method having an excellent productivity, e.g., sputtering, the suitable rectification characteristics are developed. The semiconductor device of the invention is excellent especially in a use application to a vertical type Schottky barrier diode.

<Regarding Formula (I)>

The following formula (1) is established usually in an insulator in which any carriers are not present.

$$J_{ins} = (9/8)\mu\varepsilon(V^2/L^3) \quad (1),$$

in which
$J_{ins}$: current density (A/cm$^2$),
μ: mobility (cm$^2$Ns),
ε: dielectric constant (F/cm) of a substance,
V: applied voltage (V), and
L: thickness (cm) of a region where a current flows.

On the other hand, the following formula (2) is established concerning a conductor in which a carrier is present.

$$J_{ohm} = qn\mu(V/L) \quad (2),$$

in which
$J_{ohm}$: current density (A/cm$^2$),
q: elementary charge (1.602×10$^{-19}$ C),
n: carrier concentration (cm$^{-3}$),
μ: mobility (cm$^2$/V·s), V: applied voltage (V), and
L: thickness (cm) of a region where a current flows.

On conditions to achieve $J_{ins} = J_{ohm}$, the following formula (3) is established.

$$n = \frac{8\varepsilon V}{9qL^2} \quad (3)$$

in which n, ε, V, q and L are the same as those in the formulae (1) and (2).

Therefore, when the following formula (4) is established, a relation of $J_{ins} > J_{ohm}$ is established to mean that contribution of insulated conduction is large. That is, it is meant that the external carrier functions as the main factor for the electric conduction.

$$n < \frac{\varepsilon V}{qL^2} \quad (4)$$

in which n, ε, V, q and L are the same as those in the formulae (1) and (2).

In a Schottky barrier diode, a junction field effect transistor (JFET) or a metal oxide semiconductor field effect transistor (MOSFET) which exhibits the rectification characteristics in uni-polar, a drift region is present, and in general, the relation of the above formula (2) is established in the drift region. In this case, the applied voltage V means a voltage to be applied to a drift layer. In the above formula (I), Ve is defined as the forward effective voltage, but when an actual device configuration is taken into consideration, contrarily to the applied voltage V, the Ve means an effective voltage to the drift layer excluding the contribution of the built-in voltage $V_{bi}$ to eliminate band bending or the like.

In a device of the Schottky barrier diode, the junction field effect transistor (JFET), the metal oxide semiconductor field effect transistor (MOSFET) or the like, when the device comprises a semiconductor layer between a pair of an ohmic electrode and a Schottky electrode and satisfies the above formula (I), the external carrier functions as the main factor for the electric conduction.

The dielectric constant ε is a product of a specific dielectric constant $\varepsilon_r$ of the semiconductor and the dielectric constant $\varepsilon_0$ in vacuo (8.854×10$^{-14}$ ). The $\varepsilon_r$ is a parameter which varies with materials, but is preferably from 3 to 20, more preferably from 5 to 16, and further preferably from 9 to 13. When the specific dielectric constant is excessively low, there are risks that the external carrier might be injected less and a high current might not be obtainable. When the specific dielectric constant is excessively large, hysteresis might be generated in increase of a parasitic capacitance or current characteristics.

In relation to the forward effective voltage Ve, considering that the voltage applied to the uni-polar type power device during use of actual forward characteristics is usually from about 0.5 V to 1.5 V and that the built-in voltage $V_{bi}$ is usually from about 0.7 to 1.3 V, it can be regarded that the Ve is about 0.1 V. A value of the elementary charge is 1.602×10$^{-19}$ C, and hence if the $\varepsilon_r$ is 10, in view of the formula (I), an upper limit of the carrier concentration n is determined by the distance L between the pair of the ohmic electrode and the Schottky electrode on the semiconductor layer, as shown in Table 1.

TABLE 1

| L(nm) | n(cm-3) |
|---|---|
| 10 | 5.47E+17 |
| 20 | 1.37E+17 |
| 50 | 2.19E+16 |
| 100 | 5.47E+15 |
| 200 | 1.37E+15 |
| 300 | 6.07E+14 |
| 500 | 2.19E+14 |
| 1000 | 5.47E+13 |
| 2000 | 1.37E+13 |
| 5000 | 2.19E+12 |
| 10000 | 5.47E+11 |

L is preferably 10 nm<L<100000 nm, more preferably 20 nm<L<10000 nm, further preferably 30 nm<L<1000 nm, and most preferably 50 nm<L<300 nm. When the distance L between the electrodes is excessively short, there are risks that a problem from a viewpoint of a withstand voltage might occur, and when the L is excessively long, a current value might decrease, or a film thickness of the semiconductor layer might increase, and much time might be required for film formation in the vertical type device.

The L and n satisfy a relation shown in preferably the following formula (I-a), more preferably the following formula (I-b), further preferably the following formula (I-c), and especially preferably the following formula (I-d).

$$\frac{\varepsilon V_e}{qL^2} \times 10^{-7} < n < \frac{\varepsilon V_e}{qL^2} \quad \text{(I-a)}$$

$$\frac{\varepsilon V_e}{qL^2} \times 10^{-5} < n < \frac{\varepsilon V_e}{qL^2} \quad \text{(I-b)}$$

$$\frac{\varepsilon V_e}{qL^2} \times 10^{-3} < n < \frac{\varepsilon V_e}{qL^2} \quad \text{(I-c)}$$

$$\frac{\varepsilon V_e}{qL^2} \times 10^{-3} < n < \frac{\varepsilon V_e}{qL^2} \times 10^{-1} \quad \text{(I-d)}$$

in which n, ε, Ve, q and L are the same as those in the formula (I).

When the n is excessively low, there are risks that a trap which is present in the semiconductor layer might have an influence to increase contribution of a diffusion current and the current characteristics might deteriorate. On the other hand, when the n has a value of $\varepsilon V_e/qL^2$ or more in the formula (I), contribution of a drift current increases, and behavior characteristics come close to conventional behavior characteristics to hardly produce the effect of the invention.

<Withstand Voltage of Semiconductor Device>

The semiconductor device of the invention comprises a semiconductor layer between a pair of an ohmic electrode and a Schottky electrode. As compared with the conventional power device, a designed carrier concentration is lower, and hence a designed withstand voltage $V_{BD}$ is from $V_{BD}$ to EcL, whereas a conventional withstand voltage is from $V_{BD}$ to ECL/2. In comparison with the conventional power device having the same L, it can be expected that the withstand voltage increases as much as about two times. Here, the Ec is a maximum dielectric breakdown field and the L is a length between the electrodes.

Furthermore, in the conventional power device, the initial carrier concentration is high, and hence when a reverse bias is applied, a leak current is large. Additionally, it is difficult to take a device configuration where, when vertical lines are drawn from an outer periphery (a side surface) of a surface of the Schottky electrode toward the surface of the ohmic electrode, the surface of the ohmic electrode is present inside the vertical lines from the surface of the Schottky electrode. In the invention, the initial carrier concentration in the semiconductor layer is low, and when a forward voltage is applied, the external carrier is injected only into a range where, when vertical lines are drawn from the outer periphery of a surface of the Schottky electrode toward the surface of the ohmic electrode, the surface of the ohmic electrode is present inside the vertical lines from the periphery of a surface of the Schottky electrode. On the other hand, when the reverse bias is applied, there is less influence of leakage of a current which flows around, because the carrier is not present over the whole semiconductor layer.

Figure 5:
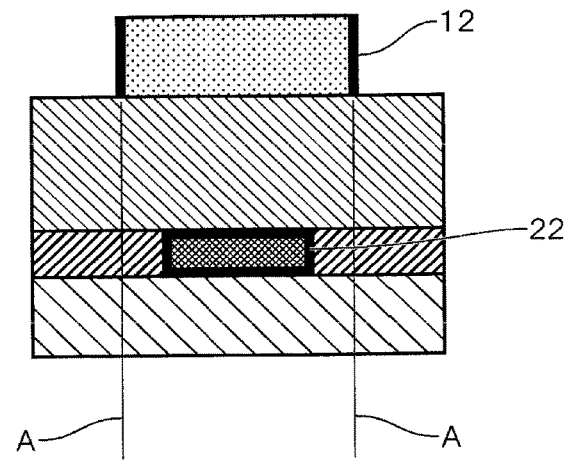
FIG. 5 is a view to explain an electrode surface of the semiconductor device in FIG. 2.

FIG. 5 is a view to explain an electrode surface of the semiconductor device in FIG. 2. In FIG. 5, the outer periphery of a surface of the Schottky electrode is a part denoted with numeral 12, and the surface of the ohmic electrode is a part denoted with numeral 22. The vertical lines drawn from the outer periphery 12 of a surface of the Schottky electrode toward the surface 22 of the ohmic electrode are denoted with character A.

In a vertical type power device, a lower part of the semiconductor layer usually forms the ohmic electrode, but when the ohmic electrode is present inside the vertical lines from the Schottky electrode, it is possible to easily use the Schottky electrode in the lower part of the semiconductor layer. Furthermore, it is known that in a usual power device, decrease of the backward leak current is achieved by using an electric field relaxing structure of a guard ring or the like, and by use of this configuration, it is possible to omit or reduce the electric field relaxing structure which has been a process demerit.

In the uni-polar type power device in which the external carrier is dominant, the withstand voltage is from $V_{BD}$ to EcL as described above, and hence the dielectric breakdown field can easily be determined from measurement results of the length L between the electrodes and the withstand voltage $V_{BD}$. Here, the withstand voltage per L corresponds to the dielectric breakdown field. When the withstand voltage per film thickness is high, the L can be decreased in designing a device having the same withstand voltage, and hence an amount of the external carrier to be injected increases. Consequently, a lower resistance device can be provided. The withstand voltage per L is preferably 0.5 MV/cm or more, more preferably 0.8 MV/cm or more, further preferably 1.0 MV/cm or more, and especially preferably 3.0 MV/cm or more. The withstand voltage per L can be obtained by measuring a breakdown voltage (V) and further dividing the voltage by the length L. For example, in the case of the Schottky barrier diode, when a backward voltage is swept, the first voltage value when the current value reaches $1 \times 10^{-3}$ A is defined as the breakdown voltage.

Furthermore, the withstand voltage per L can be adjusted by selection of a material of the semiconductor layer. In the invention, when the material of the semiconductor layer has a bandgap of 1 eV or more and is amorphous or comprises polycrystals, the withstand voltage per L can be 0.5 MV/cm or more. When the material has a bandgap of 2 eV or more, the withstand voltage per L is 1.0 MV/cm or more, and when the semiconductor layer has a bandgap of 2 eV or more and is amorphous or comprises polycrystals, the withstand voltage per L can be 3.0 MV/cm or more.

<Characteristic Temperature>

The characteristic temperature is a parameter indicating characteristics of a tail level at a conduction band lower end which are peculiar to an amorphous or polycrystal material, and in the semiconductor in which the external carrier having the tail level at the conduction band lower end is dominant, the characteristic temperature follows characteristics of the following formula (5).

$$J = N_c u e \left(\frac{\varepsilon}{eN_t}\right)^l \left(\frac{l}{l+1}\right)^l \left(\frac{2l+1}{l+1}\right)^{l+1} \frac{V^{l+1}}{L^{2l+1}} \quad (5)$$

in which
J: current density (A/cm$^2$),
u: mobility (cm$^2$Ns),
$N_c$: effective state density (cm$^{-3}$) of a semiconductor,
$N_t$: tail level density (cm$^{-3}$) in a conduction band lower portion,
ε: dielectric constant (F/cm) of a substance,
V: applied voltage (V),
L: thickness (cm) of a region where a current flows,
e: elementary charge (1.602×10$^{-19}$ C),
l: Tc/T,
Tc: characteristic temperature (K), and
T: actual temperature (K).

The characteristic temperature Tc is a parameter which satisfies Tc>T, and indicates a large value, when a tail level number is large and the conduction of the injected external carrier is disturbed by the trap. A current-voltage measurement is performed, and l is obtained from an inclination because it is seen from the formula (5) that the inclination of a graph of Log(J)-Log(V) is l+1, to calculate the Tc. However, a value of Tc which is constant to the voltage applied to a certain continuous range is an index indicating that the semiconductor layer has the tail level. The characteristic temperature is preferably Tc<1500K, more preferably Tc<900K, and further preferably Tc<600K. When the value of Tc is large, there are risks that the number of the external carriers to be trapped at the tail level might increase, and device characteristics might heighten a resistance.

The characteristic temperature can be obtained from the inclination of the graph of Log(J)-Log(V) after the current-voltage measurement is performed. The characteristic temperature can be lowered by improving a short-range order of an atomic structure in the amorphous or polycrystal semiconductor. For example, in a case of an amorphous metal oxide semiconductor, a low density film has a tendency that the short-range order is low and the characteristic temperature heightens. In an amorphous metal oxide semiconductor film formed by the sputtering, it is recognized that the density is related to film formation conditions. As a distance between a target and the substrate decreases, as a sputtering pressure decreases, as a substrate temperature during the film formation heightens or as an annealing temperature after the film formation heightens, or as a voltage applied to the target during the film formation by the sputtering heightens, a high density film is easier to form. Furthermore, when H$_2$ or H$_2$O is added in a range of 0.1 to 10 vol % as a sputtering gas during the film formation by the sputtering, the high density film is easily obtained. When the amorphous or polycrystal semiconductor layer is a metal oxide semiconductor comprising one or more elements selected from the group consisting of In, Zn, Ga and Sn, a highly symmetrical s-orbit can be utilized. Consequently, the semiconductor is hardly influenced by disturbances in periodic potentials and the characteristic temperature easily lowers.

<Lamination of Drift Layer (Limited to the Vertical Type Device)>

It is possible to obtain the semiconductor device (the vertical type) including, in the drift layer, a repeated structure comprising semiconductor layers ($L_1$, $L_2$, . . . $L_n$) satisfying the following formula (6) and having a low carrier concentration $n_L$ ($n_L$ and $L_n$ indicate the carrier concentration and the film thickness of the layer having the low carrier concentration and disposed at a n-th position when counted from the Schottky electrode toward the ohmic electrode), and semiconductor layers ($d_1$, $d_2$, . . . $d_{n-1}$) having a high carrier concentration $n_h$ ($n_h$ and $d_n$ indicate the carrier concentration and the film thickness of the layer having the high carrier concentration and disposed at a n-th position when counted from the Schottky electrode toward the ohmic electrode).

$$n_L > \frac{\varepsilon V_e}{qL_n^2} \quad (6)$$

in which $n_L$ is the carrier concentration of the layer having the low carrier concentration and disposed at the n-th position when counted from the Schottky electrode toward the ohmic electrode, ε is a dielectric constant of the n-th semiconductor layer having the low carrier concentration, $V_e$ is an effective voltage (may be adjusted to Ve=0.1 V) to be applied to the n-th semiconductor layer having the low carrier concentration, q is an elementary charge, and $L_n$ is the film thickness of the n-th semiconductor layer having the low carrier concentration.

In such a laminated drift configuration, increase of the withstand voltage and decrease of a resistance value can be expected more than in a single-layer drift configuration. In this case, Ln is preferably 10 nm<Ln<1000 nm, more preferably 20 nm<Ln<300 nm, further preferably 30 nm<Ln<200 nm, and especially preferably 30 nm<Ln<100 nm. When the Ln is excessively short, the constitution noticeably varies, and when the Ln is excessively long, the resistance value might increase. Furthermore, dn is preferably 3 nm<dn<30 nm, and more preferably 5 nm<dn<10 nm. When the dn is excessively long, there are risks that, when the reverse bias is applied, a depletion layer might not spread entirely from the Schottky electrode to the ohmic electrode and the problem from the viewpoint of the withstand voltage might occur. When the dn is excessively short, a function of a partition layer between Ln and Ln+1 might not be achieved, and the configuration might not function as a laminated configuration. The $n_h$ satisfies preferably the following formula (6-a), more preferably the following formula (6-b), and further preferably the following formula (6-c).

$$\frac{\varepsilon V_e}{qd_n^2} < n_h < 1 \times 10^{20} \text{cm}^{-3} \quad (6\text{-a})$$

$$1 \times 10^{16} < n_h < 1 \times 10^{19} \text{cm}^{-3} \quad (6\text{-b})$$

$$5 \times 10^{16} < n_h < 1 \times 10^{18} \text{cm}^{-3} \quad (6\text{-c})$$

in which ε is a dielectric constant of the n-th semiconductor layer having the high carrier concentration, $V_e$ is an effective voltage (may be adjusted to Ve=0.1 V) to be applied to the n-th semiconductor layer having the high carrier concentration, q is an elementary charge, and $d_n$ is a film thickness of the n-th semiconductor layer having the high carrier concentration.

When the $n_h$ is excessively large, there are risks that extension of the depletion layer during the application of the reverse bias might be inhibited, and it might be difficult to maintain the withstand voltage in the semiconductor layer having the high carrier concentration. When the $n_h$ is excessively small, it is also necessary to inject the external carrier into the layer having the high carrier concentration during application of a forward voltage, and as a result, there are risks that a plurality of semiconductor layers having the low carrier concentration might behave as one layer having the low carrier concentration to heighten the resistance value.

It is preferable that the layer in contact with the Schottky electrode is the low carrier concentration layer.

<Connection of Semiconductor Devices in Series>

In a withstand voltage design of the conventional unipolar type power device, when a voltage of a rated withstand voltage is applied, a field intensity of a semiconductor interface on a Schottky metal side reaches the vicinity of the dielectric breakdown field, and it is difficult to connect semiconductor devices. For example, in the case of the Schottky barrier diode, even if a plurality of devices having a withstand voltage of 600 V are connected in series, it is difficult to obtain a withstand voltage of 600 V or more. In the invention, when a plurality of semiconductor devices (power devices) having a low initial carrier concentration and using the externally injected carriers are connected in series, the withstand voltage increases in the form of a product of rated withstand voltages of the connected semiconductor devices. In consequence, a device having a desirable withstand voltage can easily be provided.

<Constituent Layers of Semiconductor Device>

(1) Semiconductor Layer

There are not any special restrictions on the semiconductor layer, but it is preferable that the semiconductor layer is constituted of polycrystals or amorphous. Furthermore, it is preferable that the semiconductor layer is constituted of the metal oxide semiconductor, and it is more preferable that the semiconductor layer is constituted of the metal oxide semiconductor comprising one or more elements selected from the group consisting of In, Zn, Ga, Sn and Al. The amorphous semiconductor layer has an excellent large area uniformity, decreases impact ionization when the reverse bias is applied, and effectively increases the withstand voltage. The polycrystal semiconductor layer is excellent in large area uniformity and conduction properties. When the semiconductor layer is manufactured from the metal oxide semiconductor, a film forming method using a sintered sputtering target and having excellent large area properties can be employed. By utilization of the metal oxide semiconductor containing one or more elements selected from the group consisting of In, Zn, Ga, Sn and Al in the semiconductor layer, the conduction properties of the s-orbit of a metal element can be utilized. Therefore, regardless of whether the semiconductor layer is amorphous or comprises polycrystals, the orbits are superimposed on one another, to constitute the semiconductor layer having the excellent conduction properties.

The metal oxide semiconductor can contain one or 2 or more metal oxides. As the metal oxide, for example, an oxide of In, Sn, Ge, Ti, Zn, Y, Sm, Ce, Nd, Ga or Al can be enumerated. It is preferable that the semiconductor is constituted of one or more elements selected from the group consisting of In, Zn, Ga and Sn.

The metal in the metal oxide semiconductor may essentially comprise one or more elements selected from the group consisting of In, Sn, Ge, Ti, Zn, Y, Sm, Ce, Nd, Ga and Al. Furthermore, the metal may contain, for example, 95 atom % or more, 98 atom % or more or 99 atom % or more of one or more elements selected from the group consisting of In, Sn, Ge, Ti, Zn, Y, Sm, Ce, Nd, Ga and Al.

It is preferable that the metal oxide constituting the metal oxide semiconductor satisfies atom ratios of the following formulae (A) to (C). Such a composition can achieve a high withstand voltage and a low on-resistance.

$$0 \leq x/(x+y+z) \leq 0.8 \quad (A),$$

$$0 \leq y/(x+y+z) \leq 0.8 \quad (B), \text{ and}$$

$$0 \leq z/(x+y+z) \leq 1.0 \quad (C),$$

in which x indicates the number of atoms of one or more elements selected from the group consisting of In, Sn, Ge and Ti, y indicates the number of atoms of one or more elements selected from the group consisting of Zn, Y, Sm, Ce and Nd, and z indicates the number of atoms of one or more elements selected from the group consisting of Ga and Al.

When the ratio of the x is in excess of 0.8 and the x indicates In or Sn, there are risks that insulation properties of the metal oxide might lower and Schottky junction might hardly be obtained, and when the x indicates Ge or Ti, the insulation properties of the metal oxide might heighten, and heat generation due to ohmic loss might be caused.

More preferably, the above compositions (A) to (C) satisfy the following formulae (A-1) to (C-1), respectively.

$$0 \leq x/(x+y+z) \leq 0.7 \quad (A-1),$$

$$0 \leq y/(x+y+z) \leq 0.8 \quad (B-1), \text{ and}$$

when z indicates Ga, $0.02 \leq z/(x+y+z) \leq 1.0$, and when z indicates Al, $0.005 \leq z/(x+y+z) \leq 0.5 \quad (C-1),$ in which x, y and z are the same as those in the above formulae (A) to (C).

When the z indicates Ga and its ratio is lower than 0.02, there are risks that oxygen in the metal oxide might easily be desorbed, and electric characteristics might vary.

Further preferably, the above compositions (A) to (C) satisfy the following formulae (A-2) to (C-2), respectively.

$$0.1 \leq x/(x+y+z) \leq 0.5 \quad (A-2),$$

$$0.1 \leq y/(x+y+z) \leq 0.5 \quad (B-2), \text{ and}$$

$$0.03 \leq z/(x+y+z) \leq 0.5 \quad (C-2),$$

in which x and y are the same as those in the above formulae (A) to (C) and z indicates Ga.

Moreover, the above compositions (A) and (C) preferably satisfy the following formulae (A-3) and (C-3), respectively.

$$0 \leq x/(x+y+z) \leq 0.25 \quad (A-3), \text{ and}$$

$$0.3 \leq z/(x+y+z) \leq 1.0 \quad (C-3),$$

in which x, y and z are the same as those in the above formulae (A) and (C).

The metal oxide constituting the metal oxide semiconductor layer may be amorphous or crystalline and crystals may be microcrystals or monocrystals. Preferably, the metal oxide is amorphous or comprises microcrystals. When the metal oxide contains the monocrystals, crystal growth is started from seed crystals, or a method such as molecular beam epitaxy (MBE) or pulsed laser deposition (PLD) is used. When the crystal growth is achieved on a $SiO_2$ surface or a metal surface, crystal defects are easily generated, and when the semiconductor device is used as a device to pass electricity in a vertical direction, the crystal defects might cause failure. When the crystal growth is achieved on the SiO$_2$ surface or the metal surface, a heating temperature, time and others are appropriately adjusted so that grain sizes do not excessively increase.

On the other hand, in the case of amorphous, even if a dangling bond is present, the bond is not present as the crystal defect. Consequently, variances of the electric characteristics or noticeable deterioration of characteristics can be alleviated. Furthermore, the metal oxide has strong ion binding properties differently from a Si semiconductor or the like of a covalent bond, and hence a level obtained by the dangling bond is close to that of a conduction band or a filled band. Therefore, in the metal oxide, a difference in electric characteristics such as the mobility and others between structures is smaller than that of Si, SiC or the like. When such properties of the metal oxide are positively utilized, a large current diode or a switching device having a high withstand voltage and a high reliability can be provided at a high yield ratio, without any dependency on monocrystals.

Here, "the amorphous" indicates the metal oxide layer in which clear diffraction spots cannot be obtained, when a cross section of the metal oxide layer in a film thickness direction is acquired and evaluated by an electron beam diffraction technique of a transmission electron microscope or the like. It is preferable to acquire a diffraction image from a broad region where an area irradiated with an electron beam has a size of about 10 nm. The clear spots mean that symmetric diffraction points are observed from the diffraction image.

Moreover, there are also cases where "the amorphous" partially includes a crystallized or microcrystallized portion. When such a partially crystalized portion is irradiated with the electron beam, the diffraction image is recognized sometimes.

"A microcrystal structure" indicates a structure where a crystal grain size is a submicron or less and any clear grain boundaries are not present.

"The polycrystals" indicate that the crystal grain size is in excess of a micron size and the clear grain boundaries are present.

The carrier concentration of each layer constituting the metal oxide semiconductor layer is usually from $1 \times 10^{11}$ to $1 \times 10^{18}$ cm$^{-3}$, and for example, from $1 \times 10^{13}$ to $1 \times 10^{18}$ cm$^{-3}$. The carrier concentration can be obtained by, for example, the CV measurement.

Properties to be required for the diode include high speed switching, the high withstand voltage and the low on-resistance, but when the semiconductor device made of the metal oxide is used, these characteristic properties are compatible with one another. This is because the metal oxide originally has a broad bandgap and the high withstand voltage. Furthermore, properties that an n-type semiconductor is easily formed and a p-type semiconductor cannot easily be formed due to the oxygen deficiency are suitable for the high speed switching.

The crystallization may be performed for increase of the mobility to decrease the on-resistance, but the crystallization is preferably stopped to such an extent that the crystal grain boundaries are not formed. In the crystal grain boundaries, pores are often present, and when an electric field is applied to the boundaries, there are risks that polarization might occur, and this polarization might deteriorate withstand voltage properties. When a withstand voltage remarkably drops, it is more preferable to use the layer which remains to be amorphous. In the case of the use of the amorphous layer, heating treatment conditions may be adjusted to, for example, 500° C. or less and 1 hour or less, which depends on a type of element which forms the metal oxide layer. By the heating at the low temperature of 500° C. or less, a stable amorphous state can be obtained.

There are not any special restrictions on the film thickness of the semiconductor layer, but the film thickness is usually from 100 to 8000 nm.

(2) Schottky Electrode

There are not any special restrictions on the metal constituting the Schottky electrode, but the Schottky electrode preferably comprises one or more metals (including alloys) selected from the group consisting of Pd, Mo, Pt, Ir, Ru, Ni, W, Cr, Re, Te, Mn, Os, Fe, Rh and Co, and an oxide thereof, and more preferably comprises one or more metals (including alloys) selected from the group consisting of Pd, Pt, Ir and Ru, and an oxide thereof.

Additionally, it is preferable the metal or the metal oxide forms a suitable Schottky contact with the withstand voltage layer of the above-mentioned oxide semiconductor layer. A Pd oxide, a Pt oxide, an Ir oxide or a Ru oxide which forms a high Schottky barrier in a combination with the oxide semiconductor is more preferable. There are cases where these oxides form a semiconductor or an insulator usually in accordance with an oxidation state, but when compositions or film preparing conditions are selected, it is possible to form a suitable Schottky contact with the oxide semiconductor while maintaining a metal state having a high carrier density. When the oxide forms the suitable Schottky electrode, it is preferable that the carrier concentration of the Schottky electrode is $10^{18}$ cm$^{-3}$ or more. When the carrier concentration is less than $10^{18}$ cm$^{-3}$, the contact with the oxide semiconductor layer constitutes a p-n junction, and fast response and other characteristics of the Schottky barrier diode might be impaired. The carrier concentration can be obtained by, for example, hole measurement.

There are not any special restrictions on a manufacturing method to obtain the metal oxide layer, but a method of performing reactive sputtering of the metal target under an oxygen-containing atmosphere can suitably be used.

A thickness of the Schottky electrode is usually from 2 nm to 500 nm and preferably from 5 nm to 200 nm. When the thickness is excessively small, the electrode might be influenced by the metal in contact therewith, to increase an on-resistance when a forward bias is applied. When the thickness is excessively large, a resistance of the electrode itself might also increase the on-resistance when the forward bias is applied, or flatness of a Schottky interface might deteriorate to decrease withstand voltage properties.

In the Schottky electrode, for the purpose of decreasing a contact resistance between the electrode and the substrate or a current extraction electrode or improving close contact properties therebetween, a plurality of layers consists of metals or metal oxides having different compositions can be laminated on a side of the Schottky electrode which is opposite to a side thereof in contact with the semiconductor layer.

(3) Ohmic Electrode

There are not any special restrictions on a material of the ohmic electrode, as long as a suitable ohmic connection to the semiconductor layer can be achieved. However, the material preferably comprises one or more metals (including alloys) selected from the group consisting of Ti, Mo, Ag, In, Al, W, Co and Ni or a compound (an oxide or the like) thereof, and more preferably comprises one or more metals (including alloys) selected from the group consisting of Mo, Ti, Au, Ag and Al or a compound thereof. Furthermore, the ohmic electrode can be constituted of a plurality of layers. For example, a Mo electrode layer is used on a side of the ohmic electrode which contacts with the semiconductor layer. Additionally, a metal layer of Au, Al or the like is thickly laminated to extract a large current, and this layer can be used as a base for wire bonding.

A thickness of the ohmic electrode is usually from 10 nm to 5 µm.

(4) Film Preparing Method

There are not any special restrictions on a film preparing method of each layer, but it is possible to use a CVD method such as a thermal CVD method, a CAT-CVD method, an optical CVD method, a mist CVD method, an MO-CVD method or a plasma CVD method, a film preparing method under control of an atomic level, e.g., MBE or ALD, a PVD method such as ion plating, ion beam sputtering or magnetron sputtering, a method using heretofore known ceramics steps, e.g., a doctor blade method, an injection method, an extrusion method, a hot pressing method, a sol-gel method or an aerosol deposition method, or a wet method such as a coating method, a spin coating method, a printing method, a spray method, an electrodeposition method, a plating method or a micelle electrolytic method.

It is preferable that the film forming method of the semiconductor layer is a sputtering method, when the metal oxide semiconductor is selected. It is preferable that at least one type of a film forming gas is selected from the group consisting of a rare gas, oxygen, hydrogen and water. A distance (a TS space) between the sputtering target and the substrate is preferably from 10 mm to 200 mm. When the TS space is excessively short, there are risks that discharge might not be achievable. When the TS space is excessively long, a film quality of the semiconductor might become sparse, and the film having a high characteristic temperature might be formed.

(5) Substrate

There are not any special restrictions on the substrate of the semiconductor device, and a known substrate can be used. As the substrate, a conductive substrate, a semiconductor substrate, an insulating substrate and others can be enumerated.

In the vertical type semiconductor device, as shown in FIGS. 1 and 2, the conductive substrate can be used. The conductive substrate can be disposed in contact with the Schottky electrode or the ohmic electrode. As the conductive substrate, a heretofore known substrate having an excellent surface smoothness, e.g., a silicon monocrystal substrate, a silicon polycrystal substrate or a silicon crystal substrate can be used. Furthermore, except for the silicon substrate, a semiconductor substrate such as a SiC substrate, a GaN substrate or a GaAs substrate can be used. A metal substrate having an excellent conductivity, e.g., an Al substrate, a Cu substrate or a Ni substrate is also utilizable. In consideration of mass productivity and cost, the silicon substrate is preferable. As the silicon substrate, an n-type, an i-type and a p-type are present based on presence/absence and type of doping, but the n-type or the p-type is preferable in that an electric resistance is small, when the current flows in a vertical direction. As a dopant, heretofore known B, P, Sb or the like can be used. Especially when the resistance is to be lowered, As or red phosphorus may be used as the dopant.

In the horizontal type semiconductor device, as shown in FIG. 4, the insulating substrate can be used. The insulating substrate can be disposed in contact with the semiconductor layer. There are not any special restrictions on the insulating substrate, as long as the substrate has insulation properties, and the substrate can arbitrarily be selected from the group consisting of substrates usually used in a range where the effect of the invention is not lost. For example, it is possible to use an alkali-free glass substrate such as quartz glass, barium borosilicate glass, aluminoborosilicate glass, aluminosilicate glass or the like which are prepared by a fusion method or a float method, a ceramic substrate, a plastic substrate having heat resisting properties to withstand a treatment temperature of a main preparation step, or the like.

Furthermore, a dielectric substrate may be used as the insulating substrate.

As the dielectric substrate, for example, a lithium niobate substrate, a lithium tantalate substrate, a zinc oxide substrate, a quartz substrate and a sapphire substrate can be enumerated.

Additionally, a substrate comprising an insulating film or a dielectric film on the surface of a metal substrate of stainless steel alloy or the like may be used. In addition, the insulating film may be formed as a base film on the substrate. As the base film, a single layer of a silicon oxide film, a silicon nitride film, a silicon oxynitride film, a silicon nitrided oxide film or the like or a laminated layer thereof can be formed by using the CVD method, the sputtering method or the like.

There are not any special restrictions on a material of the semiconductor substrate, as long as the smoothness of the surface is kept.

As the semiconductor substrate, an Si substrate, a GaN substrate, a SiC substrate, a GaP substrate, a GaAs substrate, a ZnO substrate, a $Ga_2O_3$ substrate, a GaSb substrate, an InP substrate, an InAs substrate, an InSb substrate, a ZnS substrate, a ZnTe substrate, a diamond substrate and the like are enumerated in which the carrier concentration is adjusted to $1\times10^{18}$ $cm^{-3}$ or less.

The semiconductor substrate may contain monocrystals or polycrystals. Furthermore, the substrate may be an amorphous substrate or a substrate partially amorphous. There may be used a substrate in which a semiconductor film is formed on a conductor substrate, a semiconductor substrate, or an insulating substrate by use of a technique such as CVD (chemical vapor deposition).

As the substrate, there may be used a base material comprising an arbitrary structure consisting of a plurality of materials, a layer structure, a circuit, wires, electrodes and others on the above-mentioned conductive substrate, semiconductor substrate or insulating substrate.

As the material of the arbitrary structure, various composite materials of metals and insulators such as a metal and an interlayer insulating film forming a back end of line of a large-scale integrated circuit (LSI) or the like can be enumerated.

There are not any special restrictions on layers of the layer structure, and there can be used known layers such as an electrode layer, an insulating layer, a semiconductor layer, a dielectric layer, a protective film layer, a stress buffer layer, a light shielding layer, an electron/hole injection layer, an electron/hole transport layer, a light emitting layer, an electron/hole blocking layer, a crystal growth layer, a close contact property improving layer, a memory layer, liquid crystal layer, a capacitor layer and a power storage layer.

As the electrode layer, in general, there can be enumerated an Al layer, an Si layer, an Sc layer, a Ti layer, a V layer, a Cr layer, an Ni layer, a Cu layer, a Zn layer, a Ga layer, a Ge layer, a Y layer, a Zr layer, an Nb layer, an Mo layer, a Tc layer, an Ru layer, an Rh layer, a Pd layer, an Ag layer, a Cd layer, an In layer, an Sn layer, an Sb layer, a Te layer, an Hf layer, a Ta layer, a W layer, an Re layer, an Os layer, an Ir layer, a Pt layer, an Au layer, an alloy layer comprising one or more metals selected from the group consisting of the metals of these layers, an oxide electrode layer and others.

An oxide semiconductor or a semiconductor of Si or the like can be used in the electrode layer after the carrier concentration thereof is increased.

As the insulating layer, in general, there can be enumerated an oxide insulating film, a nitride film and others comprising one or more metals selected from the group consisting of Al, Si, Sc, Ti, V, Cr, Ni, Cu, Zn, Ga, Ge, Y, Zr, Nb, Mo, Tc, Ru, Rh, Pd, Ag, Cd, In, Sn, Sb, Te, Hf, Ta, W, Re, Os, Ir, Pt and Au.

As the semiconductor layer, there can broadly be enumerated an Si layer, a GaN layer, an SiC layer, a GaP layer, a GaAs layer, a GaSb layer, an InP layer, an InAs layer, an InSb layer, a ZnS layer, a ZnTe layer, a diamond layer, an oxide semiconductor layer of $Ga_2O_3$, ZnO, InGaZnO or the like, and an organic semiconductor layer of pentacene or the like, irrespective of a crystal state of monocrystals, polycrystals or amorphous.

As the dielectric layer, there can be enumerated a lithium niobate layer, a lithium tantalate layer, a zinc oxide layer, a quartz substrate layer, a sapphire layer, a $BaTiO_3$ layer, a $Pb(Zr, Ti)O_3$ (PZT) layer, a $(Pb, La)(Zr, Ti)O_3$ (PLZT) layer, a $Pb(Zr, Ti, Nb)O_3$ (PZTN) layer, a $Pb(Ni, Nb)O_3$—$PbTiO_3$ (PNN-PT) layer, a $Pb(Ni, Nb)O_3$—$PbZnO_3$ (PNN-PZ) layer, a $Pb(Mg, Nb)O_3$—$PbTiO_3$ (PMN-PT) layer, an $SrBi_2Ta_2O_9$ (SBT) layer, a $(K, Na)TaO_3$ layer, a $(K, Na)NbO_3$ layer, a $BiFeO_3$ layer, a $Bi(Nd, La)TiO_x$ layer (x=2.5 to 3.0), an HfSiO(N) layer, an $HfO_2$—$Al_2O_3$ layer, an $La_2O_3$ layer, an $La_2O_3$—$Al_2O_3$ layer and others.

As the film in the protective film layer, there can be enumerated a film having excellent insulation properties and having a low permeability such as water, regardless of whether the film is inorganic or organic. As the protective film layer, for example, a $SiO_2$ layer, a SiNx layer (x=1.20 to 1.33), a SiON layer and an $Al_2O_3$ layer can be enumerated.

As the stress buffer layer, an AlGaN layer and others can be enumerated.

As the light shielding layer, for example, a black matric layer comprising a metal, a metal-organic material or the like and a color filter layer can be enumerated.

As the electron/hole injection layer, an oxide semiconductor layer, an organic semiconductor layer and others can be enumerated.

As the electron/hole transport layer, the oxide semiconductor layer, the organic semiconductor layer and others can be enumerated.

As the light emitting layer, an inorganic semiconductor layer, the organic semiconductor layer and others can be enumerated.

As the electron/hole blocking layer, the oxide semiconductor layer and the like can be enumerated.

As the base material, there can be enumerated a power generation device, a light emission device, a sensor, a power conversion device, a calculation device, a protection device, an optoelectronics device, a display, a memory, a semiconductor device comprising the back end of the line, a power storage device and others.

The layer structure may comprise a single layer or two or more layers.

The semiconductor device of the invention can be used as a power semiconductor device, a (rectifier) diode device, a Schottky barrier diode device, an electrostatic discharge (ESD) protection diode, a transient voltage suppressor (TVS) protection diode, a light emission diode, a metal semiconductor field effect transistor (MESFET), a junction field effect transistor (JFET), a metal oxide semiconductor field effect transistor (MOSFET), a Schottky source/drain MOSFET, an avalanche multiplication type photoelectric conversion device, a solid-state imaging device, a solar battery device, an optical sensor device, a display device, a resistance change memory or the like. In particular, the large current can be extracted, and hence the device is also suitable for a power use application. An electronic circuit using this device can be used in an electric apparatus, an electronic apparatus, a vehicle, a power engine or the like.

EXAMPLES

Example 1

An n-type Si substrate having a resistivity of 0.001 Ω·cm (a diameter of 4 inches and a thickness of 250 μm) was disposed in a sputtering apparatus (E-2005 manufactured by Anelva Corporation), and the following laminated electrode was formed. Additionally, a substrate back surface was treated with 100 nm of Ti/50 nm of Au to eliminate a contact resistance with a prober at measurement. Initially, a film of Ti was formed in a thickness of 15 nm with DC of 50 W in an Ar atmosphere, next a film of Pd was formed in a thickness of 50 nm with DC of 50 W in the Ar atmosphere, and finally, as a Schottky electrode, a film of PdO was formed in a thickness of 20 nm with DC of 50 W in a mixed gas atmosphere of Ar and $O_2$.

Next, this substrate was set together with an areamask for a semiconductor in a sputtering apparatus (CS-200 manufactured by ULVAC), and as a withstand voltage layer (a semiconductor layer), a film of InGaZnO was formed in a thickness of 200 nm (In:Ga:Zn (atom ratio)=1:1:1). Hereinafter, an oxide of this composition will be described as "InGaZnO (1:1:1)", and as to another composite oxide, ratios of atoms other than oxygen will similarly be described. Film forming conditions were adjusted to DC of 300 W and a mixed gas atmosphere of Ar and $H_2O$ (an $H_2O$ concentration: 1 vol %). A distance between a sputtering target and a substrate (a TS space) was adjusted to 80 mm. This substrate was taken outside, and annealed in an electric furnace at 300° C. in air for 1 hour. This substrate was set together with an areamask for electrodes (a hole diameter of 50 μm) again in the sputtering apparatus, and then as an ohmic electrode (a diameter of 50 μm), a film of Mo was formed in a thickness of 150 nm. Afterward, as an Al electrode, a film was formed in a thickness of 2 μm by use of the same mask. Film forming conditions for both electrodes were adjusted to DC of 100 W and an Ar atmosphere. As a final treatment, an aging treatment was performed at 200° C. under the atmospheric air for 1 hour.

Additionally, as shown in FIG. 1, a device configuration comprised a Schottky electrode under a semiconductor layer, and was characterized in that when vertical lines were drawn from an outer periphery of a surface of the Schottky electrode toward the surface of the ohmic electrode, the surface of the ohmic electrode was present inside the vertical lines.

<Distance L Between Electrodes>

A distance L between the electrodes was acquired from an image of a cross section in a transmission electron microscope (TEM) and an image of energy dispersive X-ray spectroscopy (EDX) of the cross section in the TEM. It was supposed that a layer which comprised InGaZnO was the semiconductor layer, the Schottky electrode was a PdO layer, and the ohmic electrode was Mo, and a region where contrast of the TEM sectional image matched that of the layer which comprised InGaZnO in the EDX was considered as the semiconductor layer, and the distance L between the electrodes was defined. Furthermore, the above semiconductor layer was sandwiched between Pd and Mo in the EDX, and the distance L between the electrodes was 200 nm.

When a reverse bias was applied, the semiconductor layer was depleted, and when a forward bias was applied, the semiconductor layer functioned as a resistive layer. Such properties were utilized, and in CV (capacitance-voltage) measurement, it was confirmed that the thickness required for a semiconductor function was the above L without any problems. On the basis of a minimum capacitance value $C_{min}$ when a reverse voltage was applied and a maximum capacitance value $C_{max}$ when a forward voltage was applied, a film thickness $d_{min}$ for $C_{min}$ and a film thickness $d_{max}$ for $C_{max}$ were obtained by using a relational formula of $C/A = \varepsilon_r \times \varepsilon_0/d$, and a difference between the thicknesses fell within a value of L±50% of L. Therefore, it was verified that the distance L between the electrodes was 200 nm. However, it was confirmed that a specific dielectric constant of InGaZnO (1:1:1) of the present film forming technique was 16 in a film thickness measurement, and hence $\varepsilon_r = 16$ was used. In general, it is reported that the specific dielectric constant of InGaZnO is a value of about 10 to 19.

In the above relational formula,
C: capacitance value (F),
A: effective area ($cm^2$) of the electrode,
d: film thickness (cm) for the function of the semiconductor,
$\varepsilon_r$: specific dielectric constant, and
$\varepsilon_0$: dielectric constant in vacuo, 8.854E-14 [F/cm].

Here, the effective area A of the electrode indicates an area of the electrode which is present inside an area of the semiconductor layer, in a pair of the ohmic electrode and the Schottky electrode separated from each other. In the present example, the area of the ohmic electrode having a diameter of 50 μm can be considered as A.

Additionally, during the CV measurement, the following CMU unit of B1505 was used, and a voltage was superimposed by a bias T to perform the measurement. A measurement frequency of 1 kHz was used, and an AC amplitude was adjusted to 0.03 V.

<Identification of Electrode Type>

In identification of electrode types, the above semiconductor layer was identified, and then the electrode types between which a semiconductor layer material was to be sandwiched were considered as the ohmic electrode and the Schottky electrode, to perform the identification. In the sectional EDX image, it was presumed that a metal or a metal compound containing Mo and Pd was the ohmic electrode or the Schottky electrode. By confirmation of rectification characteristics, it was judged that a Mo side was an ohmic electrode type and a Pd side was a Schottky electrode type. Furthermore, by X-ray photoelectron spectroscopy (XPS) in a depth direction, an XPS spectrum was confirmed while performing Ar sputtering of a device in the depth direction. A peak derived from oxygen in a Mo spectrum of the XPS from the Mo side toward a Mo/InGaZnO interface gradually increased in accordance with a concentration of oxygen contained in InGaZnO, and in a Mo layer separated from an InGaZnO layer, 90% or more of the XPS spectrum focused on Mo was attributable to pure Mo. Consequently, it was judged that the ohmic electrode was made of Mo.

On the other hand, in an InGaZnO/PdO interface, a peak derived from oxygen in a Pd spectrum of the XPS from an InGaZnO side toward Pd did not gradually decrease in accordance with the concentration of oxygen contained in InGaZnO, and an approximately certain degree of oxygen was contained in Pd. Additionally, in a region of the EDX image where Pd was observed, contrast of the TEM image was clearly recognized, and a region containing Pd in a thickness of 20 nm and having an electron density smaller than that of pure Pd was present between a pure Pd region and an InGaZnO region in the XPS of the depth direction. Consequently, it was judged that the Schottky electrode was a layer made of Pd or PdO and having a thickness of about 20 nm, which is shown in Table 2-1 as Pd(PdO).

<Evaluation of Crystalline Properties>

Crystalline properties were evaluated by an electron beam diffraction technique when the cross section of the semiconductor layer was observed with the TEM. In an area irradiated with an electron beam, a diffraction image was acquired from a region having a diameter of 10 nm or more. At a plurality of points in a film thickness direction and a direction parallel to the cross section, any spot shapes were not confirmed in the diffraction image, and hence it was judged that the semiconductor layer was amorphous.

<Electric Characteristic Result>

As to the obtained element, voltage (V)-current (J) characteristics and voltage (V)-capacitance (C) characteristics were measured by using the unit B1505 (HVSMU, HCSMU, MFCMU or MPSMU was mounted), the bias T (N1272A) and a circuit switcher (N1258A) manufactured by Keysight Technologies, and a high voltage prober EPS 150 TESLA manufactured by Cascade Microtech, Inc. In addition, the following respective items were evaluated. Table 2-1 shows the results.

Additionally, during the measurement, the above SMU or CMU was disposed on a Schottky electrode side, and the bias was applied. An ohmic electrode side had a state where 0 V was applied.

(1) Measurement of Carrier Concentration

A carrier concentration was acquired by using the above apparatus and the above-mentioned CV measurement. Then, $A^2/C^2$ was plotted along the ordinate and an applied voltage V was plotted along the abscissa, to prepare a graph in which an inclination of a straight line from a starting point between 0 V and 2 V was proportional to $-2/(\varepsilon_r \varepsilon_0 N_{depl})$. It was considered that a carrier concentration $n = N_{depl}$, and the carrier concentration of the semiconductor layer was obtained by utilizing the proportionality of the inclination. The carrier concentration was $1.0 \times 10^{14}$ $cm^{-3}$ as shown in Table 2-1. It was also possible to confirm, from a behavior of the CV measurement, that the semiconductor was an n-type.

Additionally, during the CV measurement, the above CMU unit of B1505 was used, and the voltage was superimposed by the bias T to perform the measurement. The measurement frequency of 1 kHz was used, and the AC amplitude was adjusted to 0.03 V.

It was possible to confirm that the present semiconductor device satisfied the following formula (I). Additionally, as described above, a dielectric constant was calculated from an InGaZnO specific dielectric constant of 16, Ve was adjusted to 0.1 V and L was adjusted to 200 nm, thereby determining a size relation.

$$n < \frac{\varepsilon V_e}{qL^2}$$

(2) Measurement of Characteristic Temperature

A characteristic temperature was obtained following the above-mentioned method. The above apparatus HCSMU was utilized, and a voltage was applied from 0 V to 3 V to apply the forward bias to the device (the HCSMU applies a positive voltage). A difference (Log $J_1$-Log $J_2$)/(Log $V_1$-Log $V_2$) of Log J-Log V, i.e., "power" of J-V characteristics was plotted along the ordinate, and V was plotted along the abscissa. Here, the J means a current density (A/cm$^2$) and has a value obtained by dividing a measured current value (A) by the above effective area of the electrode. The $J_1$, $J_2$, $V_1$ and $V_2$ are current densities and applied voltage values of measurement points 1 and 2. An average "power" was 2.5 in a range of 2 V to 3 V and a maximum or minimum value of the "power" of the present division was ±0.5 for an average value. Consequently, the present semiconductor layer was considered as a semiconductor having a tail level at a lower end of conductivity, and it was considered that the above-mentioned formula (5) was applicable. According to the above-mentioned formula (5), the "power" of 2.5 was equal to I+1, I=Tc/T, and an actual temperature at the measurement was 300K. In consequence, the characteristic temperature was obtained at 450K.

(3) Determination of Withstand Voltage

As described above, a withstand voltage can be obtained by measuring a breakdown voltage (V) and dividing the voltage by a length L. In the case of the present Schottky barrier diode, when the reverse voltage was swept, the first voltage value that reached a current value of $1\times10^{-3}$ A was defined as the breakdown voltage. When the voltage was applied in a reverse direction by use of the apparatus HVSMU, a current value reached $1\times10^{-3}$ A at −62 V, and hence the breakdown voltage was defined as −62 V. Specifically, the withstand voltage per L is an absolute value of 3.1 MV/cm obtained by dividing the breakdown voltage by 200 nm.

(4) Determination of Forward On-Resistance Ron@2V

As described above, the above apparatus HCSMU was utilized and the voltage was applied from 0 V to 2 V to apply the forward bias to the device (the HCSMU applies the positive voltage). When 2 V was applied, a current density $J_{2V}$ was measured, and a forward on-resistance Ron@2V=2 [V]/$J_{2V}$ [A/cm$^2$] was defined and calculated.

(5) Determination of Leak Current Value@-5V

A current density when a voltage of −5 V was applied in the reverse direction was obtained by using the apparatus HVSMU. The density was $-5.0\times10^{-8}$ A/cm$^2$, and hence its absolute value was taken, to determine a leak current value@-5V as $5.0\times10^{-8}$ A/cm$^2$.

Examples 2 to 5, 9, 18 and 19

The procedure of Example 1 was repeated except that film forming conditions were changed as shown in Tables 2-1 and 2-2, to manufacture and evaluate semiconductor devices. Tables 2-1 and 2-2 show the results. Furthermore, the semiconductor devices of these examples satisfied the formula (I).

Example 6

The procedure of Example 1 was repeated except that film forming conditions were changed as shown in Table 2-1, to manufacture and evaluate a semiconductor device. Table 2-1 shows the result. Additionally, the semiconductor device of this example satisfied the formula (I).

In this example, a material of the ohmic electrode of Example 1 was changed from Mo to Ti.

When the L was evaluated, contrast of a TEM image containing InGaZnO was shorter than 200 nm due to extraction of oxygen from the Ti electrode, and it was confirmed that a thickness of a semiconductor layer was 180 nm.

Example 7

The procedure of Example 1 was repeated except that film forming conditions were changed as shown in Table 2-1, to manufacture and evaluate a semiconductor device. Table 2-1 shows the result. Additionally, the semiconductor device of this example satisfied the formula (I).

In this example, when a Schottky electrode was prepared, sputtering was not performed with a mixed gas of Ar and $O_2$ during sputtering of Pd, and a film was formed only with Ar consistently in a thickness of 70 nm.

As a result, in an InGaZnO/PdO interface, a peak derived from oxygen in a Pd spectrum of XPS from an InGaZnO side toward Pd gradually decreased in accordance with a concentration of oxygen contained in InGaZnO, and it was not possible to conclude that oxygen was contained in Pd. Furthermore, in a region of an EDX image where Pd was observed, a region where contrast of a TEM image was clearly recognized was not present. Consequently, it was judged that the Schottky electrode was a layer made of Pd in a thickness of about 70 nm, which is shown in Table 2-1 as Pd(PdO).

Example 8

An n-type Si substrate having a resistivity of 0.001 Ω·cm (a diameter of 4 inches and a thickness of 250 μm) was disposed in a sputtering apparatus (E-2005 manufactured by Anelva Corporation), and the following laminated electrode was formed as an ohmic layer. Additionally, a substrate back surface was treated with Ti of 100 nm/Au of 50 nm to eliminate a contact resistance with a prober at measurement. Initially, a film of Ti was formed in a thickness of 15 nm with DC of 50 W in an Ar atmosphere, next a film of Ni was formed in a thickness of 50 nm with DC of 50 W in the Ar atmosphere, and finally, as an ohmic electrode, a film of Mo was formed in a thickness of 20 nm with DC of 50 W in the Ar atmosphere.

Next, this substrate was set together with an areamask for a semiconductor in a sputtering apparatus (GS-200 manufactured by ULVAC), and as a withstand voltage layer (a semiconductor layer), a film of InGaZnO (1:1:1) was formed in a thickness of 200 nm. Film forming conditions were adjusted to DC of 300 W and a mixed gas atmosphere of Ar and $H_2O$ (an $H_2O$ concentration: 1 vol %). A distance between a sputtering target and the substrate (a TS space) was adjusted to 80 mm. This substrate was taken outside, and annealed in an electric furnace at 300° C. in air for 1 hour. This substrate was set together with an areamask for electrodes (a hole diameter of 50 μm) again in the sputtering apparatus, and then as a Schottky electrode (a diameter of 50 μm), a film of PdO was formed in a thickness of 50 nm by use of a Pd target in a mixed gas of argon and oxygen. Afterward, as a Pd electrode, a film was formed in a thickness of 100 nm by use of the same mask. Film forming conditions for both electrodes were adjusted to DC of 100 W and an Ar atmosphere. As a final treatment, an aging treatment was performed at 200° C. under the atmospheric air for 1 hour.

In addition, as shown in FIG. 2, a device configuration comprised the ohmic electrode under the semiconductor layer, and was characterized in that when vertical lines were drawn from an outer periphery of a surface of the Schottky electrode toward the surface of the ohmic electrode, the surface of the ohmic electrode was present inside the vertical lines.

The procedure of Example 1 was repeated to evaluate an obtained semiconductor device. Table 2-1 shows the result. Additionally, the semiconductor device of this example satisfied the formula (I).

Example 10

The procedure of Example 1 was repeated except that film forming conditions were changed as shown in Table 2-1, to manufacture and evaluate a semiconductor device. Table 2-1 shows the result. Additionally, the semiconductor device of this example satisfied the formula (I).

In this example, an annealing temperature was raised to 500° C. after a film of a semiconductor layer was formed, and as a result, a change was seen in a diffraction image during measurement of a cross section with a TEM. Diffraction spots were broad butl present, and spot positions changed in a plurality of measurement points. Therefore, it was judged that the present semiconductor film contained polycrystals. Furthermore, due to crystallization, it was observed that a thickness of the semiconductor layer changed to 190 nm.

Example 11

The procedure of Example 1 was repeated except that film forming conditions were changed as shown in Table 2-2, to manufacture and evaluate a semiconductor device. Table 2-2 shows the result. Additionally, the semiconductor device of this example satisfied the formula (I).

In this example, Ru was used in a Schottky electrode. A configuration was Si/TI/Ru/RuO/InGaZnO/Mo. A film of RuO was formed by sputtering with a mixed gas of Ar and oxygen.

Example 12

The procedure of Example 1 was repeated except that film forming conditions were changed as shown in Table 2-2, to manufacture and evaluate a semiconductor device. Table 2-2 shows the result. Additionally, the semiconductor device of this example satisfied the formula (I).

In this example, Ni was used in a Schottky electrode. A configuration was Si/Ti/Ni/NiO/InGaZnO/Mo. A film of NiO was formed by sputtering with a mixed gas of Ar and oxygen.

Example 13

The procedure of Example 1 was repeated except that film forming conditions were changed as shown in Table 2-2, to manufacture and evaluate a semiconductor device. Table 2-2 shows the result. Additionally, the semiconductor device of this example satisfied the formula (I).

In this example, sputtering was performed by using an InSnZnO (1:1:1) target for a semiconductor layer.

Example 14

The procedure of Example 1 was repeated except that film forming conditions were changed as shown in Table 2-2, to manufacture and evaluate a semiconductor device. Table 2-2 shows the result. Additionally, the semiconductor device of this example satisfied the formula (I).

Sputtering was performed by using a $Ga_2O_3$ target for a semiconductor layer. The sputtering target had insulation properties, and hence film forming conditions of RF of 300 W were used in place of those of DC of 300 W.

Example 15

The procedure of Example 1 was repeated except that film forming conditions were changed as shown in Table 2-2, to manufacture and evaluate a semiconductor device. Table 2-2 shows the result. Additionally, the semiconductor device of this example satisfied the formula (I).

In this example, an atmosphere during film formation of a semiconductor layer contained 100 vol % of Ar, and a semiconductor annealing temperature was adjusted at 150° C. in a band. Sputtering was performed by using a $Ga_2O_3$ target for the semiconductor layer. The sputtering target had insulation properties, and hence film forming conditions of RF of 300 W were used in place of those of DC of 300 W.

Example 16

The procedure of Example 1 was repeated except that film forming conditions were changed as shown in Table 2-2, to manufacture and evaluate a semiconductor device. Table 2-2 shows the result. Additionally, the semiconductor device of this example satisfied the formula (I).

In this example, sputtering was performed by using an InAlO (93:7) target for a semiconductor layer. A change was seen in a diffraction image during measurement of an obtained cross section with a TEM. Diffraction spots were broad but present, and spot positions changed in a plurality of measurement points. However, when the diffraction image was taken in a film thickness direction, the change of the spot positions was not observed. Therefore, it was judged that the present semiconductor film contained polycrystals (a pillar shape).

Example 17

The procedure of Example 1 was repeated except that film forming conditions were changed as shown in Table 2-2, to manufacture and evaluate a semiconductor device. Table 2-2 shows the result. Additionally, the semiconductor device of this example satisfied the formula (I).

In this example, sputtering was performed by using an InGaO (1:1) target for a semiconductor layer. Furthermore, for the purpose of obtaining crystalline properties, an annealing temperature was adjusted to a high temperature of 600° C. Accordingly, similarly to Example 8, the device had a configuration where a PdO Schottky electrode was positioned on an upper part of the semiconductor layer as shown in FIG. 2. This was because PdO was reduced at the high temperature to turn to Pd and Schottky barrier properties were inhibited from deteriorating.

A change was recognized in a diffraction image during measurement of an obtained cross section with a TEM. Diffraction spots were broad but present, and spot positions changed in a plurality of measurement points. However, even when the diffraction image was taken in a film thickness direction, the change of the spot positions was not observed. Therefore, it was judged that the present semiconductor film contained polycrystals (a pillar shape).

Example 20

The procedure of Example 1 was repeated except that film forming conditions were changed as shown in Table 2-2, to manufacture and evaluate a semiconductor device. Table 2-2 shows the result.

In this example, as shown in FIG. 3, the device comprised a Schottky electrode on an upper part of a semiconductor layer, and was characterized in that when vertical lines were drawn from an outer periphery of a surface of the Schottky electrode toward the surface of an ohmic electrode, the surface of the ohmic electrode was present outside the vertical lines.

The device satisfied the formula (I), but as compared with Example 8, decrease of a withstand voltage and rise of a leak current were observed.

TABLE 2-1

| | | | Examples | | | | |
|---|---|---|---|---|---|---|---|
| | | | 1 | 2 | 3 | 4 | 5 |
| Device configuration | Semiconductor layer | Semiconductor material | InGaZnO (1:1:1) | InGaZnO (1:1:1) | InGaZnO (1:1:1) | InGaZnO (1:1:1) | InGaZnO (1:1:1) |
| | | Introduced gas at the time of film formation | Ar:99% $H_2O$:1% | Ar:90% $H_2O$:10% | Ar:89% $H_2O$:1% $O_2$:10% | Ar:90% $O_2$:10% | Ar:99% $H_2O$:1% |
| | | Crystallinity | Amorphous | Amorphous | Amorphous | Amorphous | Amorphous |
| | | TS space (mm) | 80 | 80 | 80 | 80 | 150 |
| | | Annealing temp. (° C.) | 300 | 300 | 300 | 300 | 300 |
| | | Distance L between electrodes (nm) | 200 | 200 | 200 | 200 | 200 |
| | | Ohmic electrode | Mo | Mo | Mo | Mo | Mo |
| | | Schottky electrode | Pd (PdO) | Pd (PdO) | Pd (PdO) | Pd (PdO) | Pd (PdO) |
| Evaluation results | | Device configuration | FIG. 1 | FIG. 1 | FIG. 1 | FIG. 1 | FIG. 1 |
| | | Carrier concentration n ($cm^{-3}$) | $1.0 \times 10^{14}$ | $5.0 \times 10^{14}$ | $5.0 \times 10^{13}$ | $1.0 \times 10^{15}$ | $6.0 \times 10^{14}$ |
| | | Characteristic temperature (K) | 450 | 550 | 350 | 800 | 700 |
| | | With stand voltage (MV/cm) | 3.1 | 2.1 | 3.5 | 1.5 | 2.3 |
| | | Forward on-resistance Ron @2 V ($\Omega cm^2$) | $4.0 \times 10^{-4}$ | $8.0 \times 10^{-4}$ | $3.0 \times 10^{-4}$ | $3.0 \times 10^{-3}$ | $1.0 \times 10^{-3}$ |
| | | Leak current @−5 V (A) | $5.0 \times 10^{-8}$ | $1.0 \times 10^{-7}$ | $1.0 \times 10^{-8}$ | $5.0 \times 10^{-7}$ | $2.0 \times 10^{-7}$ |
| | | Specific dielectric constant $\varepsilon_r$ | 16 | 16 | 16 | 16 | 16 |
| | | $\varepsilon Ve/qL^2$ ($cm^{-3}$) | $2.2 \times 10^{15}$ | $2.2 \times 10^{15}$ | $2.2 \times 10^{15}$ | $2.2 \times 10^{15}$ | $2.2 \times 10^{15}$ |

| | | | Examples | | | | |
|---|---|---|---|---|---|---|---|
| | | | 6 | 7 | 8 | 9 | 10 |
| Device configuration | Semiconductor layer | Semiconductor material | InGaZnO (1:1:1) | InGaZnO (1:1:1) | InGaZnO (1:1:1) | InGaZnO (1:1:1) | InGaZnO (1:1:1) |
| | | Introduced gas at the time of film formation | Ar:99% $H_2O$:1% | Ar:99% $H_2O$:1% | Ar:99% $H_2O$:1% | Ar:99% $H_2O$:1% | Ar:99% $H_2O$:1% |
| | | Crystallinity | Amorphous | Amorphous | Amorphous | Amorphous | Polycrystalline |
| | | TS space (mm) | 80 | 80 | 80 | 80 | 80 |
| | | Annealing temp. (° C.) | 300 | 300 | 300 | 400 | 500 |
| | | Distance L between electrodes (nm) | 180 | 200 | 200 | 200 | 190 |
| | | Ohmic electrode | Ti | Mo | Mo | Mo | Mo |
| | | Schottky electrode | Pd (PdO) | Pd | Pd (PdO) | Pd (PdO) | Pd (PdO) |
| Evaluation results | | Device configuration | FIG. 1 | FIG. 1 | FIG. 2 | FIG. 1 | FIG. 1 |
| | | Carrier concentration n ($cm^{-3}$) | $1.0 \times 10^{15}$ | $1.0 \times 10^{14}$ | $1.0 \times 10^{14}$ | $3.0 \times 10^{14}$ | $2.0 \times 10^{15}$ |
| | | Characteristic temperature (K) | 450 | 450 | 500 | 400 | 870 |
| | | With stand voltage (MV/cm) | 2.5 | 0.8 | 1.8 | 2.7 | 1.3 |
| | | Forward on-resistance Ron @2 V ($\Omega cm^2$) | $2.5 \times 10^{-4}$ | $3.0 \times 10^{-4}$ | $5.0 \times 10^{-4}$ | $3.2 \times 10^{-4}$ | $1.2 \times 10^{-3}$ |
| | | Leak current @−5 V (A) | $9.0 \times 10^{-8}$ | $1.0 \times 10^{-4}$ | $1.0 \times 10^{-6}$ | $3.0 \times 10^{-7}$ | $5.0 \times 10^{-4}$ |
| | | Specific dielectric constant $\varepsilon_r$ | 16 | 16 | 16 | 16 | 15 |
| | | $\varepsilon Ve/qL^2$ ($cm^{-3}$) | $2.7 \times 10^{15}$ | $2.2 \times 10^{15}$ | $2.2 \times 10^{15}$ | $2.2 \times 10^{15}$ | $2.3 \times 10^{15}$ |

TABLE 2-2

| | | | Examples | | | | |
|---|---|---|---|---|---|---|---|
| | | | 11 | 12 | 13 | 14 | 15 |
| Device configuration | Semiconductor layer | Semiconductor material | InGaZnO (1:1:1) | InGaZnO (1:1:1) | InSnZnO (1:1:1) | $Ga_2O_3$ | $Ga_2O_3$ |
| | | Introduced gas at the time of film formation | Ar:99% $H_2O$:1% | Ar:99% $H_2O$:1% | Ar:99% $H_2O$:1% | Ar:99% $H_2O$:1% | Ar:100% |
| | | Crystallinity | Amorphous | Amorphous | Amorphous | Amorphous | Amorphous |
| | | TS space (mm) | 80 | 80 | 80 | 80 | 80 |
| | | Annealing temp. (° C.) | 300 | 300 | 300 | 300 | 150 |
| | | Distance L between electrodes (nm) | 200 | 200 | 200 | 200 | 200 |
| | | Ohmic electrode | Mo | Mo | Mo | Mo | Mo |
| | | Schottky electrode | Ru (RuO) | Ni (NiO) | Pd (PdO) | Pd (PdO) | Pd (PdO) |
| Evaluation results | | Device configuration | FIG. 1 | FIG. 1 | FIG. 1 | FIG. 1 | FIG. 1 |
| | | Carrier concentration n ($cm^{-3}$) | $2.0 \times 10^{14}$ | $3.0 \times 10^{14}$ | $8.0 \times 10^{13}$ | $2.0 \times 10^{11}$ | $3.0 \times 10^{14}$ |
| | | Characteristic temperature (K) | 480 | 500 | 380 | 580 | 850 |
| | | Withstand voltage (MV/cm) | 2.4 | 2.1 | 2.4 | 3.9 | 2.2 |

TABLE 2-2-continued

|  |  | | | | | |
|---|---|---|---|---|---|---|
| | Forward on-resistance Ron @2 V ($\Omega cm^2$) | $4.5 \times 10^{-4}$ | $5.0 \times 10^{-4}$ | $2.0 \times 10^{-4}$ | $9.0 \times 10^{-3}$ | $3.0 \times 10^{-3}$ |
| | Leak current @-5 V (A) | $5.0 \times 10^{-6}$ | $5.0 \times 10^{-5}$ | $8.0 \times 10^{-8}$ | $1.0 \times 10^{-9}$ | $4.0 \times 10^{-9}$ |
| | Specific dielectric constant $\varepsilon_r$ | 16 | 16 | 12 | 14 | 14 |
| | $\varepsilon\, Ve/qL^2$ (cm$^{-3}$) | $2.2 \times 10^{15}$ | $2.2 \times 10^{15}$ | $1.7 \times 10^{15}$ | $1.9 \times 10^{15}$ | $1.9 \times 10^{15}$ |

| | | | Examples | | | | |
|---|---|---|---|---|---|---|---|
| | | | 16 | 17 | 18 | 19 | 20 |
| Device configuration | Semiconductor layer | Semiconductor material | InAlO (93:7) | InGaO (1:1) | InGaZnO (1:1:1) | InGaZnO (1:1:1) | InGaZnO (1:1:1) |
| | | Introduced gas at the time of film formation | Ar:99% H$_2$O:1% | Ar:99% H$_2$O:1% | Ar:99% H$_2$O:1% | Ar:99% H$_2$O:1% | Ar:99% H$_2$O:1% |
| | | Crystallinity | Polycrystals (pillar shape) | Polycrystals (pillar shape) | Amorphous | Amorphous | Amorphous |
| | | TS space (mm) | 80 | 80 | 80 | 80 | 80 |
| | | Annealing temp. (° C.) | 300 | 600 | 300 | 300 | 300 |
| | | Distance L between electrodes (nm) | 200 | 200 | 100 | 500 | 200 |
| | | Ohmic electrode | Mo | In | Mo | Mo | Mo |
| | | Schottky electrode | Pd (PdO) | Pd (PdO) | Pd (PdO) | Pd (PdO) | Pd (PdO) |
| | | Device configuration | FIG. 1 | FIG. 2 | FIG. 1 | FIG. 1 | FIG. 3 |
| Evaluation results | | Carrier concentration n (cm$^{-3}$) | $8.0 \times 10^{14}$ | $2.0 \times 10^{12}$ | $1.0 \times 10^{14}$ | $3.0 \times 10^{14}$ | $1.0 \times 10^{14}$ |
| | | Characteristic temperature (K) | 330 | 410 | 400 | 500 | 450 |
| | | Withstand voltage (MV/cm) | 1.9 | 1.3 | 3.3 | 2.9 | 0.9 |
| | | Forward on-resistance Ron @2 V ($\Omega cm^2$) | $8.0 \times 10^{-5}$ | $2.0 \times 10^{-4}$ | $4.0 \times 10^{-5}$ | $9.0 \times 10^{-3}$ | $5.0 \times 10^{-4}$ |
| | | Leak current @-5 V (A) | $7.0 \times 10^{-7}$ | $1.5 \times 10^{-6}$ | $1.0 \times 10^{-7}$ | $1.0 \times 10^{-8}$ | $5.0 \times 10^{-5}$ |
| | | Specific dielectric constant $\varepsilon_r$ | 11 | 12 | 16 | 16 | 16 |
| | | $\varepsilon\, Ve/qL^2$ (cm$^{-3}$) | $1.5 \times 10^{15}$ | $1.7 \times 10^{15}$ | $8.8 \times 10^{15}$ | $3.5 \times 10^{14}$ | $2.2 \times 10^{15}$ |

Comparative Example 1

The procedure of Example 1 was repeated except that film forming conditions were changed as shown in Table 3, to manufacture and evaluate a semiconductor device. Table 3 shows the result.

In this example, an atmosphere during formation of a film of InGaZnO contained 100 vol % of Ar. Furthermore, annealing was not performed after a semiconductor film was formed. As a result, a carrier concentration was outside a range of the formula (I). Additionally, a withstand voltage was also 0.1 MV/cm, and hence it became difficult to adapt these characteristics to a power use application. When a voltage of −5 V was applied, a leak current was above 100 mA which was a compliance current value of a measurement apparatus, and the leak current was not measurable. Therefore, Table 3 shows >1.0×10$^{−3}$ A.

Comparative Example 2

The procedure of Example 1 was repeated except that film forming conditions were changed as shown in Table 3, to manufacture and evaluate a semiconductor device. Table 3 shows the result.

In this example, film formation for a Pd/PdO layer was omitted, so that a Schottky electrode contained Ti. As a result, rectification characteristics were observed, but a carrier concentration was outside a range of the formula (I). Additionally, a leak current was high, a withstand voltage was also 0.3 MV/cm, and hence it became difficult to adapt these characteristics to a power use application.

Comparative Example 3

The procedure of Example 1 was repeated except that film forming conditions were changed as shown in Table 3, to manufacture and evaluate a semiconductor device. Table 3 shows the result.

In this example, sputtering was performed by using an In$_2$O$_3$ target for a semiconductor layer. A change was seen in an obtained diffraction image during measurement of a cross section with a TEM. Diffraction spots were broad but present, and spot positions changed in a plurality of measurement points. However, even when the diffraction image was taken in a film thickness direction, the change of the spot positions was not observed. Therefore, it was judged that the present semiconductor film contained polycrystals (a pillar shape).

As for electric characteristics, a carrier concentration was high, a prepared Schottky diode could not obtain a rectification ratio, and the carrier concentration could not be measured by CV measurement. Furthermore, a forward "power" continued to maintain a value of 2 or less in a range of 2 to 3 V. Therefore, it was judged that a relation of the formula (5) was not established, and it was considered that a characteristic temperature could not be evaluated. Decrease of a withstand voltage and rise of a leak current were observed.

TABLE 3

| | | | Comp. Ex. | | |
|---|---|---|---|---|---|
| | | | 1 | 2 | 3 |
| Device configuration | Semiconductor layer | Semiconductor material | InGaZnO (1:1:1) | InGaZnO (1:1:1) | In$_2$O$_3$ |

TABLE 3-continued

|  |  | Comp. Ex. | | |
|---|---|---|---|---|
|  |  | 1 | 2 | 3 |
|  | Introduced gas at the time of film formation | Ar: 100% | Ar: 99% $H_2O$: 1% | Ar: 99% $H_2O$: 1% |
|  | Crystallinity | Amorphous | Amorphous | Polycrystals (pillar shape) |
|  | TS space (mm) | 80 | 80 | 80 |
|  | Annealing temp. (° C.) | None | 300 | 300 |
|  | Distance L between electrodes (nm) | 200 | 200 | 200 |
|  | Ohmic electrode | Mo | Mo | Mo |
|  | Schottky electrode | Pd (PdO) | Ti | Pd (PdO) |
|  | Device configuration | FIG. 1 | FIG. 1 | FIG. 1 |
| Evaluation result | Carrier concentration n ($cm^{-3}$) | $2.0 \times 10^{17}$ | $6.0 \times 10^{15}$ | — |
|  | Characteristic temperature (K) | 1300 | 700 | — |
|  | Withstand voltage (MV/cm) | 0.1 | 0.3 | 0.1 |
|  | Forward on-resistance Ron @2 V ($\Omega cm^2$) | $6.0 \times 10^{-5}$ | $7.0 \times 10^{-4}$ | $5.0 \times 10^{-5}$ |
|  | Leak current@−5 V (A) | $>1.0 \times 10^{-3}$ | $8.0 \times 10^{-4}$ | $>1.0 \times 10^{-3}$ |
|  | Specific dielectric constant $\epsilon_r$ | 16 | 16 | 10 |
|  | $\epsilon V_e/qL^2$ ($cm^{-3}$) | $2.2 \times 10^{15}$ | $2.2 \times 10^{15}$ | $1.4 \times 10^{15}$ |

INDUSTRIAL APPLICABILITY

A semiconductor device of the invention can be used in a Schottky barrier diode or a junction transistor. Furthermore, these devices can be used in an electronic circuit, and are utilized in any electric apparatus.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The specification of the Japanese patent applications claiming the priority under the Paris Convention to the invention is incorporated herein by reference in its entirety.

The invention claimed is:

1. A semiconductor device which comprises a pair of an ohmic electrode and a Schottky electrode separated from each other, and
a semiconductor layer in contact with the ohmic electrode and the Schottky electrode, and
which satisfies the following formula (I):

$$n < \frac{\varepsilon V_e}{qL^2} \tag{I}$$

in which n is a carrier concentration ($cm^{-3}$) of the semiconductor layer, ε is a dielectric constant (F/cm) of the semiconductor layer, $V_e$ is a forward effective voltage (V) between the ohmic electrode and the Schottky electrode, q is an elementary charge (C), and L is a distance (cm) between the ohmic electrode and the Schottky electrode.

2. The semiconductor device according to claim 1, wherein the semiconductor layer consists of a metal oxide.

3. The semiconductor device according to claim 2, wherein the metal oxide comprises one or more elements selected from the group consisting of In, Zn, Ga, Sn and Al.

4. The semiconductor device according to claim 1, wherein the Schottky electrode comprises one or more metals selected from the group consisting of Pd, Mo, Pt, Ir, Ru, W, Cr, Re, Te, Mn, Os, Fe, Rh, Co and Ni, and an oxide thereof.

5. The semiconductor device according to claim 1, wherein the ohmic electrode comprises one or more metals selected from the group consisting of Ti, Mo, Ag, In, Al, W, Co and Ni, and a compound thereof.

6. The semiconductor device according to claim 1, wherein the semiconductor layer is amorphous or comprises polycrystals.

7. The semiconductor device according to claim 1, wherein a characteristic temperature of the semiconductor layer is 1500K or less.

8. The semiconductor device according to claim 1, wherein when vertical lines are drawn from an outer periphery of a surface of the Schottky electrode toward a surface of the ohmic electrode, the surface of the ohmic electrode is present inside the vertical lines.

9. The semiconductor device according to claim 1, wherein a withstand voltage is 0.5 MV/cm or more.

10. The semiconductor device according to claim 1, wherein the semiconductor layer is interposed between the ohmic electrode and the Schottky electrode.

11. The semiconductor device according to claim 10, which further comprises a conductive silicon substrate,
wherein the ohmic electrode or the Schottky electrode contacts with the conductive silicon substrate.

12. The semiconductor device according to claim 1, wherein the ohmic electrode and the Schottky electrode are present, separated from each other, on one surface of the semiconductor layer.

13. A Schottky barrier diode wherein the semiconductor device according to claim 1 is used.

14. A junction transistor wherein the semiconductor device according to claim 1 is used.

15. An electronic circuit wherein the semiconductor device according to claim 1 is used.

16. An electric apparatus, an electronic apparatus, a vehicle or a power engine wherein the electronic circuit according to claim 15 is used.

17. An electronic circuit wherein the Schottky barrier diode according to claim 13 is used.

18. An electric apparatus, an electronic apparatus, a vehicle or a power engine wherein the electronic circuit according to claim 17 is used.

19. An electronic circuit wherein the junction transistor according to claim 14 is used.

20. An electric apparatus, an electronic apparatus, a vehicle or a power engine wherein the electronic circuit according to claim 19 is used.

\* \* \* \* \*